(12) United States Patent
Jiang et al.

(10) Patent No.: US 7,198,980 B2
(45) Date of Patent: Apr. 3, 2007

(54) METHODS FOR ASSEMBLING MULTIPLE SEMICONDUCTOR DEVICES

(75) Inventors: Tongbi Jiang, Boise, ID (US); Setho Sing Fee, Singapore (SG); Tay Wuu Yean, Singapore (SG); Lim Thiam Chye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/706,576

(22) Filed: Nov. 12, 2003

(65) Prior Publication Data

US 2004/0106229 A1 Jun. 3, 2004

Related U.S. Application Data

(62) Division of application No. 10/184,340, filed on Jun. 27, 2002, now Pat. No. 6,906,415.

(51) Int. Cl.
*H01L 23/538* (2006.01)
(52) U.S. Cl. ............................... 438/107; 257/E23.175
(58) Field of Classification Search ................ 257/723, 257/724, 777, 778, 782, 786, E23.169, E23.175; 438/106, 107, 108, 109
See application file for complete search history.

(56) References Cited

U.S. PATENT DOCUMENTS

| | | | |
|---|---|---|---|
| 5,506,383 A | 4/1996 | Chen | |
| 5,541,450 A | 7/1996 | Jones et al. | |
| 5,639,695 A | 6/1997 | Jones et al. | |
| 5,719,436 A | 2/1998 | Kuhn | |
| 5,841,191 A * | 11/1998 | Chia et al. | 257/691 |
| 5,869,894 A | 2/1999 | Degani et al. | |
| 5,926,029 A | 7/1999 | Ference et al. | |
| 5,949,135 A | 9/1999 | Washida et al. | |
| 5,977,640 A * | 11/1999 | Bertin et al. | 257/777 |
| 6,100,804 A | 8/2000 | Brady et al. | |
| 6,172,419 B1 | 1/2001 | Kinsman | |
| 6,201,302 B1 | 3/2001 | Tzu | |
| 6,326,696 B1 | 12/2001 | Horton et al. | |
| 6,343,019 B1 * | 1/2002 | Jiang et al. | 361/761 |
| 6,365,963 B1 | 4/2002 | Shimada | |
| 6,388,333 B1 * | 5/2002 | Taniguchi et al. | 257/777 |

(Continued)

OTHER PUBLICATIONS

Australian Search Report, dated Feb. 28, 2005 (3 pages).

*Primary Examiner*—Carl Whitehead, Jr.
*Assistant Examiner*—Jennifer M. Dolan
(74) *Attorney, Agent, or Firm*—TraskBritt

(57) ABSTRACT

A multidie semiconductor device (MDSCD) package includes a generally planar interposer comprising a substrate with a central receptacle, upper surface conductors, and outer connectors on the lower surface of the interposer. Conductive vias connect upper surface conductors with outer connectors. One or more semiconductor devices may be mounted in the receptacle and one or more other semiconductor devices mounted above and/or below the interposer and attached thereto. The package may be configured to have a footprint not significantly larger than the footprint of the largest device and/or a thickness not significantly greater than the combined thickness of included devices. Methods for assembling and encapsulating packages from multidie wafers and multi-interposer sheets or strips are disclosed. Methods for combining a plurality of packages into a single stacked package are disclosed. The methods may include use of somewhat laterally extending intermediate conductive elements, flip-chip style electrical connection, or both within the same package.

22 Claims, 10 Drawing Sheets

U.S. PATENT DOCUMENTS

| | | |
|---|---|---|
| 6,395,578 B1 | 5/2002 | Shin et al. |
| 6,414,381 B1 | 7/2002 | Takeda |
| 6,441,495 B1 * | 8/2002 | Oka et al. .................... 257/777 |
| 6,452,278 B1 | 9/2002 | DiCaprio et al. |
| 6,469,395 B1 | 10/2002 | Nishihara et al. |
| 6,506,633 B1 | 1/2003 | Cheng et al. |
| 6,515,356 B1 | 2/2003 | Shin et al. |
| 6,693,362 B2 * | 2/2004 | Seyama et al. ............. 257/777 |
| 6,762,078 B2 | 7/2004 | Shin et al. |
| 6,791,195 B2 * | 9/2004 | Urushima .................... 257/783 |
| 6,798,049 B1 | 9/2004 | Shin et al. |
| 2001/0004128 A1 | 6/2001 | Park et al. |
| 2002/0047214 A1 * | 4/2002 | Morinaga et al. ........... 257/778 |
| 2002/0064900 A1 | 5/2002 | Nakamura |
| 2002/0127770 A1 * | 9/2002 | Vaiyapuri .................... 438/107 |
| 2002/0142513 A1 | 10/2002 | Fee et al. |
| 2003/0025199 A1 * | 2/2003 | Wu et al. .................... 257/724 |
| 2003/0085463 A1 * | 5/2003 | Gerber et al. ............... 257/724 |

* cited by examiner

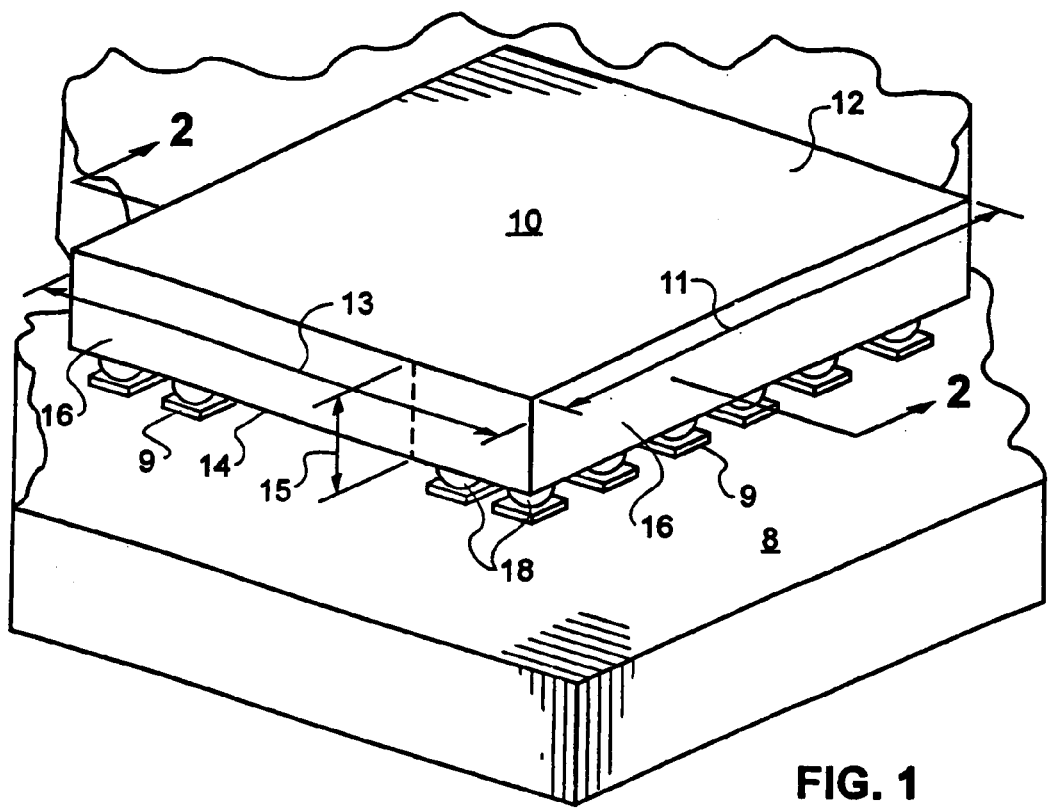
FIG. 1
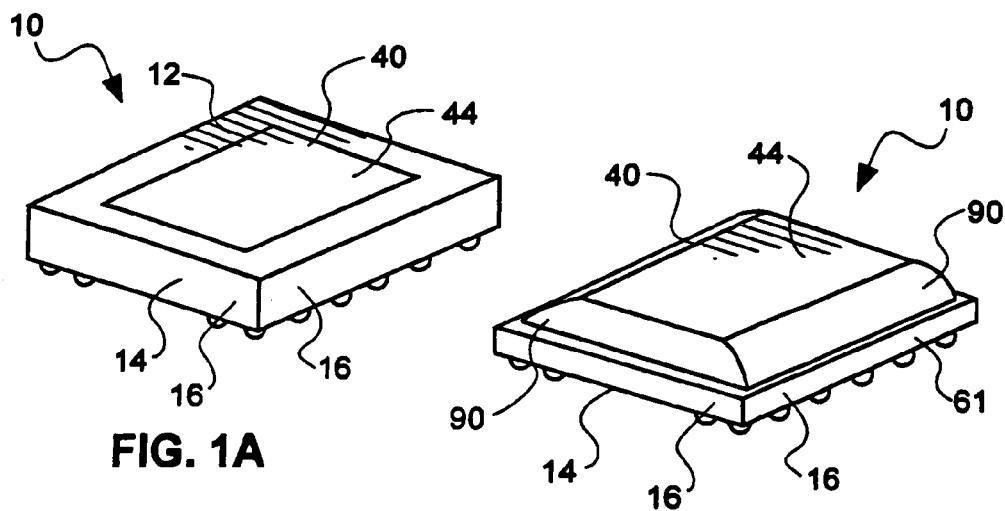
FIG. 1A
FIG. 1B

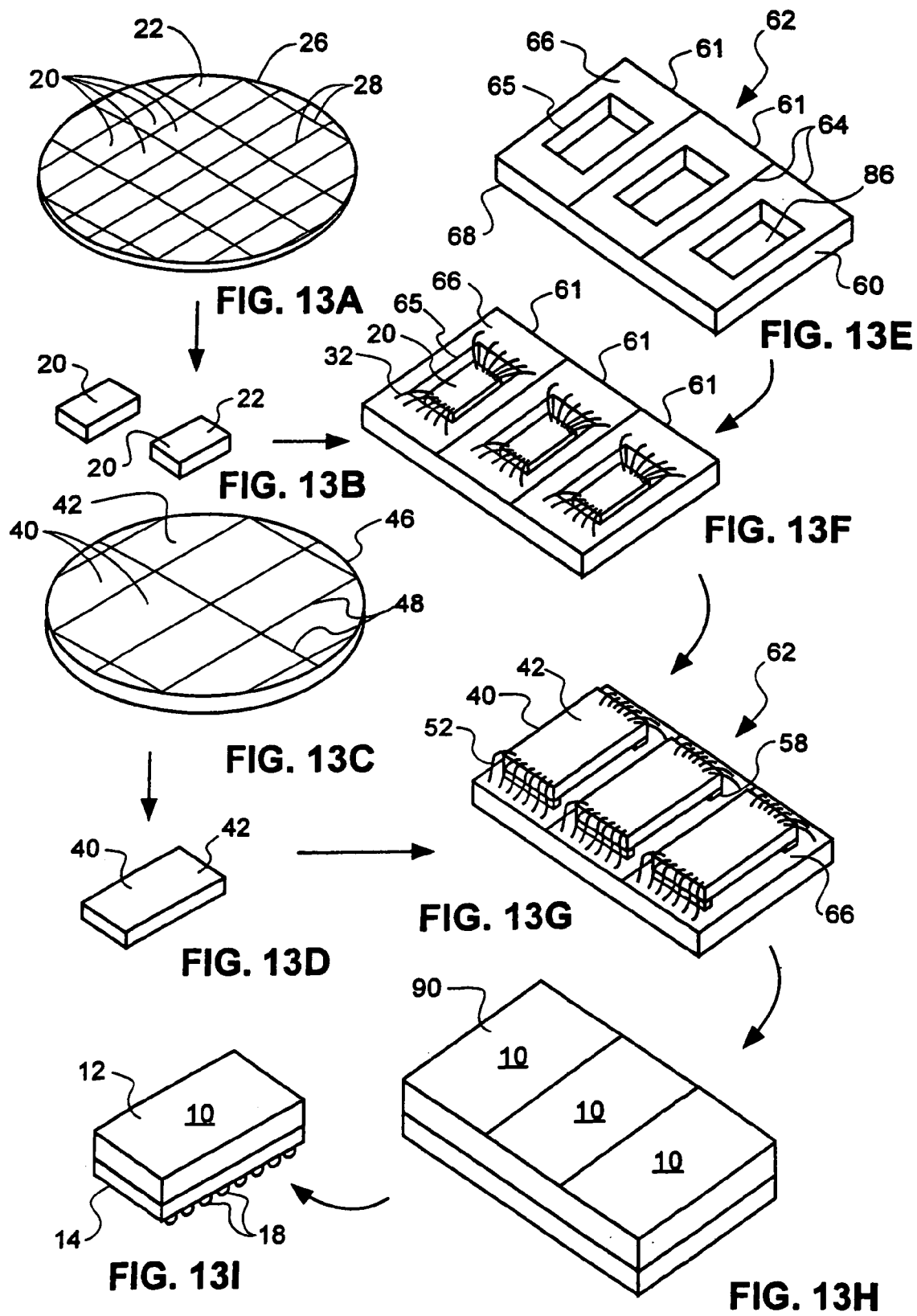

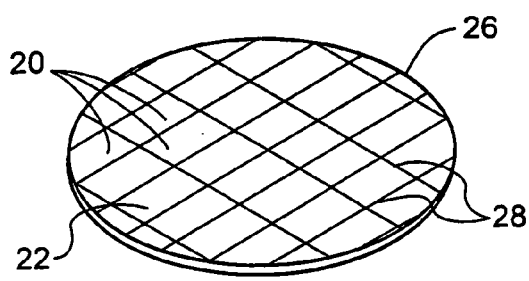
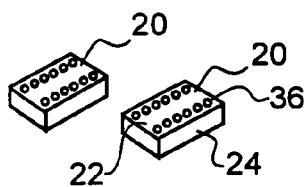
FIG. 14A
FIG. 14B
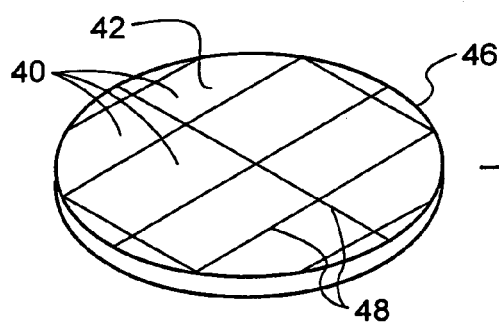
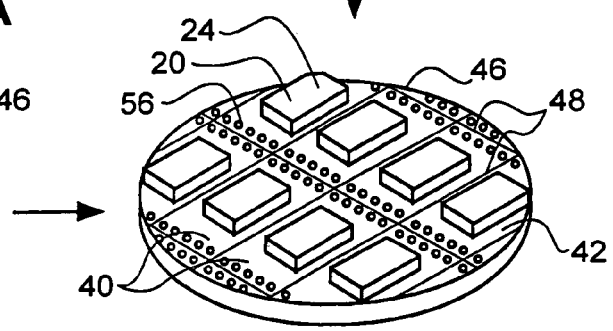
FIG. 14C
FIG. 14D
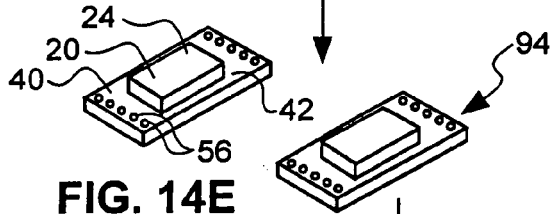
FIG. 14E
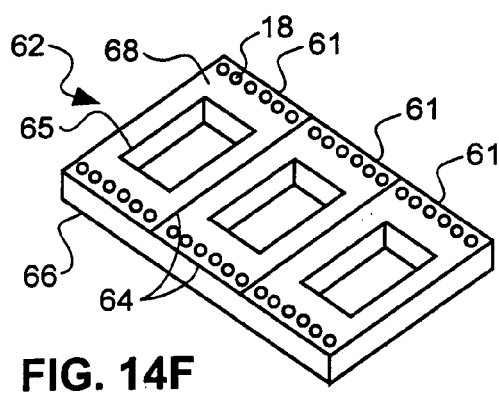
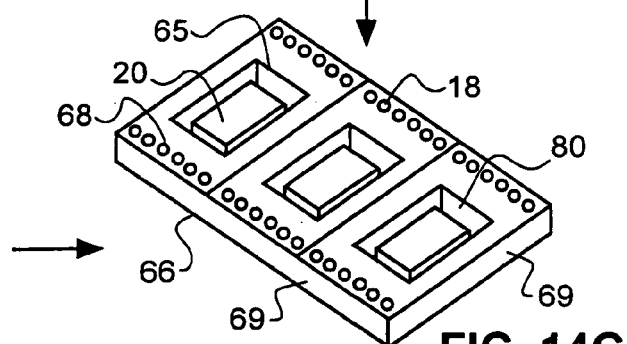
FIG. 14F
FIG. 14G
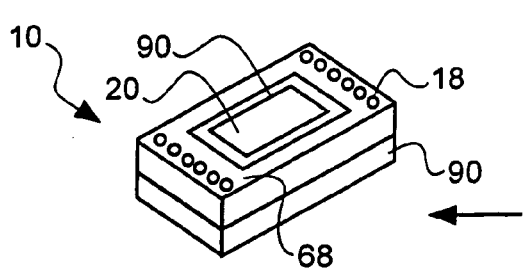
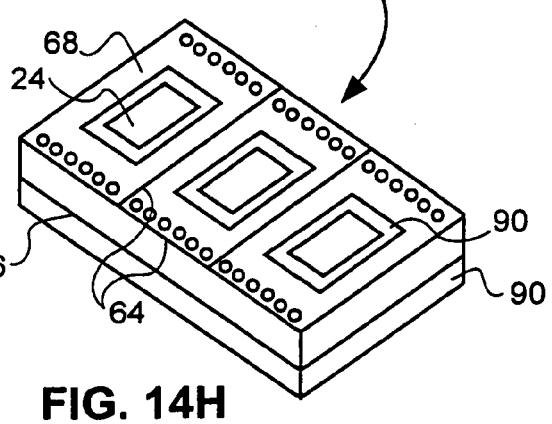
FIG. 14I
FIG. 14H

TO FIG. 15H

METHODS FOR ASSEMBLING MULTIPLE SEMICONDUCTOR DEVICES

CROSS-REFERENCE TO RELATED APPLICATION

This application is a divisional of application Ser. No. 10/184,340, filed Jun. 27, 2002, now U.S. Pat. No. 6,906,415, issued Jun. 14, 2005.

BACKGROUND OF THE INVENTION

Field of the Invention

The present invention relates generally to stacked semiconductor device assemblies and packages, as well as to associated assembly and packaging methods. More particularly, the invention pertains to multidie assemblies and packages with low profiles and minimal size.

The dimensions of many different types of state of the art electronic devices are ever decreasing. To reduce the dimensions of electronic devices, the structures by which the microprocessors, memory devices, other semiconductor devices, and other electronic components of these devices are packaged and assembled with carriers, such as circuit boards, must become more compact. In general, the goal is to economically produce a chip-scale package (CSP) of the smallest size possible, and with conductive structures, such as leads, pins, or conductive bumps, which do not significantly contribute to the overall size in the X, Y, or Z dimensions, all while maintaining a very high performance level.

One approach to reducing the sizes of assemblies of semiconductor devices and circuit boards has been to minimize the profiles of the semiconductor devices and other electronic components upon carrier substrates (e.g., circuit boards) so as to reduce the distances the semiconductor devices protrude from the carrier substrates. Various types of packaging technologies have been developed to facilitate orientation of semiconductor devices upon carrier substrates in this manner.

Conventionally, semiconductor device packages have been multilayered structures, typically including a bottom layer of encapsulant material, a carrier (e.g., leads, a circuit board, etc.), a semiconductor die, and a top layer of encapsulant material, for example. In addition, the leads, conductive bumps, or pins of conventional semiconductor device packages, which electrically connect such packages to carrier substrates, as well as provide support for the packages, are sometimes configured to space the semiconductor device packages apart from a carrier substrate. As a result, the overall thicknesses of these semiconductor device packages and the distances the packages protrude from carrier substrates are greater than is often desired for use in state of the art electronic devices.

"Flip-chip" technology, as originating with controlled collapse chip connection (C-4) technology, is an example of an assembly and packaging technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has solder balls arranged in a so-called "ball grid array" (BGA) connection pattern, typically includes a semiconductor die arid a carrier substrate, which is typically termed an "interposer." The interposer may be positioned adjacent either the back side of the semiconductor die or the active (front) surface thereof.

When the interposer is positioned adjacent the back side of the semiconductor die, the bond pads of the semiconductor die are typically electrically connected by way of wire bonds or other intermediate conductive elements to corresponding contact areas on a top side of the interposer. These contact areas communicate with corresponding bumped contact pads on the back side of the interposer. This type of flip-chip assembly is positioned adjacent a higher-level carrier substrate with the back side of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding contact pads on the interposer. In this type of flip-chip semiconductor device assembly, however, the contact pads are also typically located on the top surface of the interposer. Accordingly, this type of flip-chip assembly is positioned adjacent a higher-level carrier substrate, such as a printed circuit board, by orienting the interposer with the top surface facing the carrier substrate.

In each of the foregoing types of flip-chip semiconductor devices, the contact pads of the interposer are disposed in an array that has a footprint that mirrors an arrangement of corresponding terminals or other contact regions formed on a carrier substrate. Each of the bond (on bare flip-chip semiconductor dice) or contact (on flip-chip packages) pads and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate. In addition, each of the foregoing types of flip-chip semiconductor devices may include an encapsulant material covering portions or substantially all of the interposer and/or the semiconductor die.

The thicknesses of conventional flip-chip type packages having ball grid array connection patterns are defined by the combined thicknesses of the semiconductor die, the interposer, the adhesive material therebetween, and the conductive structures (e.g., solder balls) that protrude above the interposer or the semiconductor die. As with the flat packages, conventional flip-chip type packages are often undesirably thick for use in small, thin, state of the art electronic devices. Furthermore, use of this general construction method for producing a stacked multichip module (MCM) results in a relatively high-profile, large footprint device.

Thinner, or low-profile, flip-chip type packages have been developed which include interposers or other carriers with recesses that are configured to receive at least a portion of the profiles of semiconductor devices. While interposers that include recesses for partially receiving semiconductor devices facilitate the fabrication of thinner flip-chip type packages, the semiconductor dice of these packages, as well as intermediate conductive elements that protrude beyond the outer surfaces of either the semiconductor dice or the interposers, undesirably add to the thicknesses of these packages.

U.S. Pat. Nos. 5,541,450 and 5,639,695, both issued to Jones et al. (hereinafter "the '450 and '695 Patents"), disclose another type of flip-chip type package, which includes an interposer with a semiconductor die receptacle extending completely therethrough. The '695 Patent teaches a package that may be formed by securing a semiconductor die directly to a carrier substrate and electrically connecting the interposer to the carrier substrate before the semiconductor die is electrically connected to the interposer. The semiconductor die, intermediate conductive elements that connect bond pads of the semiconductor die to corresponding contact areas on the interposer, and regions of the interposer adjacent the receptacle may then be encapsulated. While this method results in a very low-profile flip-chip type package, the package cannot be tested separately from the carrier substrate. As a result, if the package is unreliable, it may also be necessary to discard the carrier substrate and any other components thereon. Moreover, the packaging method of the '695 Patent complicates the process of connecting semiconductor devices and other electronic components to a carrier substrate. In addition, it should be noted that in order to obtain a low-profile package, it may be necessary to sacrifice footprint compactness. The footprint area of such a low-profile package may be significantly greater than the area of the semiconductor die thereof.

Thus, there is a need for multidie assemblies and packages that have low profiles and relatively small footprints and for methods for fabricating such assemblies and packages.

SUMMARY OF THE INVENTION

The present invention comprises a semiconductor device package including an interposer and a plurality of semiconductor devices in a vertical or stacked arrangement. The invention includes various embodiments of the device package and methods for assembling and packaging two or more semiconductor devices with an interposer. The semiconductor device package may comprise a chip scale multichip package (CSMCP) which is configurable in various ways for use in a variety of applications, including as a memory package. The package may be formed with a thickness not much greater than the cumulative thicknesses of the devices and, also, may have a relatively "footprint."

The package interposer of the present invention includes a substantially planar substrate with a receptacle formed therein and extending substantially therethrough, i.e., from the upper surface to the lower surface thereof. The receptacle is considered to be a first level of the package and is configured to receive one or more semiconductor devices (e.g., semiconductor dice), which will be collectively referred to herein as "first-level" semiconductor devices. The receptacle may be configured to accept several devices in a side-by-side manner and/or stacked arrangement. In addition, the interposer includes conductors on both major surfaces thereof. The conductors may include circuit traces, level(s) of submerged traces, conductive vias connecting the traces, and conductive bond pads and/or contact areas for attachment of bond wires, solder balls or other intermediate conductive elements, discrete conductive elements, and outer connectors. The first-level semiconductor device(s) may be electrically attached to the interposer or to a second-level semiconductor device at least partially superimposed relative to the interposer.

A "second-level" (e.g., upper) semiconductor device is at least partially superimposed relative to the interposer and generally to the first-level semiconductor device(s) within the interposer receptacle. The second-level semiconductor device may have its active surface facing upwardly, with its bond pads electrically connected to corresponding contact areas on the upper surface of the interposer by way of somewhat laterally extending intermediate conductive elements. Alternatively, peripheral contact areas on the second-level semiconductor device may be flip-chip bonded to contact areas on the interposer. If the first-level semiconductor device is flip-chip connected to corresponding contact areas on the active surface of the second-level semiconductor device, the active surfaces of the first- and second-level semiconductor devices face each other. Conductive traces and vias extend from the conductive areas on the interposer to corresponding outer connectors on the interposer, which are arranged in an array over the lower surface of the interposer. For small footprint packages, microvias having a diameter as small as 50 microns or smaller may be used and may be directly attached to bond pads or solder ball contact areas, for example, greatly decreasing the interposer area required for connections within a package.

Optionally, a structure such as a film or tape (e.g., a pressure-sensitive, adhesive-coated film) may be positioned on the lower side of the interposer to cover the receptacle opening, thereby closing off the bottom end of the receptacle to facilitate the positioning of one or more semiconductor devices within the receptacle. The film may be removably secured to the interposer, thereby facilitating the removal of the film following attachment of the second semiconductor device or an encapsulation process. Thus, a further reduction in the thickness of the package may be achieved.

As already indicated, more than one semiconductor device may be positioned within the receptacle. If a film covers the lower end of the receptacle, the device(s) may be secured to the film (e.g., tape or other member) to fix the position of the semiconductor device(s) relative to the substrate of the interposer. The first assembly level, which is coplanar with the interposer, may comprise several sublevels at which semiconductor devices are positioned in a generally coplanar configuration or in a stacked arrangement.

A "third-level" semiconductor device may be positioned below the lower surface of the interposer and connected thereto, such as by a ball grid array (BGA) connection pattern of electrical connectors or other known elements and arrangements for making electrical connections. Each of the semiconductor devices communicates with the outer connectors of the package through electrical conductors, such as metal traces, bond pads, contact areas, or conductive vias.

A so-called "underfill" dielectric material may be placed in the interstices between the semiconductor devices and the interposer to secure the semiconductor devices to the interposer and to provide additional electrical insulation between the semiconductor devices and the interposer. For example, a liquid underfill polymeric material may be permitted to flow into the narrow interstitial spaces within the package and substantially fill the spaces by capillary action. Thermal or other cure methods may be used. In addition, or alternatively, the multidie package may be subjected to additional (full or partial) encapsulation, for example, by transfer molding, pot molding, or injection molding techniques. Multidie packages incorporating teachings of the invention may be encapsulated with the second and/or third semiconductor devices fully enclosed or, optionally, with their back sides exposed. The latter configuration further reduces the profile dimension.

The multidie packages may be configured to be integrally stacked to form packages of greater numbers of devices. The outer connectors, e.g., a BGA, on the lower surface of an upper package are joined to an array of corresponding contact areas on the upper surface of a lower package.

The multidie packages of this invention have a low profile, whereby the overall height is not much greater than the combined heights of the plurality of devices in each package. Furthermore, this low profile is achieved while simultaneously maintaining a package footprint which is only slightly larger than the footprint of the largest device in the package. In some configurations, the package footprint is essentially identical to the footprint of the largest device.

As described herein, the first-level or lower semiconductor device is smaller (in footprint) than the second-level (or upper) semiconductor device. Where a third-level semiconductor device is placed below the interposer, it is typically intermediate in footprint size, i.e., between the sizes of the first- and second-level semiconductor devices.

Several exemplary methods for assembling the multidie packages in accordance with the invention are presented. Each of the methods includes the initial formation of (a) a first multidie wafer of semiconductor devices (first-level semiconductor devices), (b) a second multidie wafer of semiconductor devices (second-level semiconductor devices), (c) additional multidie wafers of semiconductor devices if desired to be incorporated in the package, at a third-level, for example, and (d) a multi-interposer sheet or strip of substrate (rigid or flexible), having through-receptacles formed in individual interposer portions. The order of subsequent steps of assembly depends upon the final package configuration which is to be formed. Generally, each package is fully formed on a multi-interposer sheet or strip and singulated therefrom following device attachment and encapsulation.

An exemplary method for assembling a semiconductor multidevice package (SCMDP) includes (a) singulating the first-level semiconductor devices, positioning them in the receptacles of the interposers, and wire-bonding their bond pads to contact areas on the upper surface of the interposer; (b) singulating the second-level semiconductor devices, attaching them atop the interposers with a die-attach tape or adhesive, and wire-bonding their bond pads to other contact areas on the upper surface of the interposer; (c) applying an encapsulating material to fill the interstitial spaces and, optionally, to cover outer surfaces of the interposer and devices, and (d) singulating individual packages from the substrate sheet or strip. Outer connectors may be formed on the lower surface of the interposer (substrate) at any of several steps in the assembly process.

In another method for assembling a semiconductor device package in accordance with teachings of the present invention, (a) first-level semiconductor devices are singulated and attached, flip-chip style, to the active surface of the second-level semiconductor devices, typically with a BGA, (b) the second-level semiconductor devices, carrying the first-level semiconductor devices, are singulated and attached to the interposers in flip-chip style (active surface down), so that the first-level semiconductor devices are enclosed in the interposer receptacles, and (c) the sheet or strip of packages is encapsulated and individual packages singulated from the sheet or strip.

In a further assembly method utilizing flip-chip technology, second-level semiconductor devices are first singulated and attached in flip-chip arrangement to the sheet or strip of substrate and at least partially cover the upper ends of the receptacles. First-level semiconductor devices are then singulated and positioned within the receptacles of the inverted substrate sheet/strip. The first-level semiconductor devices are then joined to the second-level semiconductor devices in flip-chip fashion, followed by encapsulation and package singulation.

The encapsulant material may be disposed over the active surface of each semiconductor device located within the receptacle, as well as over intermediate conductive elements that connect the bond pads to their corresponding conductive areas on a surface of the interposer and adjacent portions of that surface of the interposer. Once each semiconductor device is held in place within the receptacle by encapsulant material, the tape or film (if used) that previously held the one or more semiconductor devices in place may be removed.

In the inventive packaging method, the various devices and interposer are substantially completed prior to assembly to form the multichip package. Conductive structures on each device and interposer are formed using known processes to ensure accurate continuity of the desired electrical connections between the package's devices and a carrier substrate.

The present invention also includes variations of the multichip packages of semiconductor devices, as further described.

Although various embodiments of the invention are described and illustrated herein, it is recognized that these embodiments are exemplary only and not exhaustive. Other configurations, features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments for carrying out the invention:

FIG. 1 is a perspective view of an exemplary multidie semiconductor device package in accordance with teachings of the invention;

FIG. 1A is a perspective view of another exemplary multidie semiconductor device package in accordance with teachings of the invention;

FIG. 1B is a perspective view of a further exemplary multidie semiconductor device package in accordance with teachings of the invention;

FIGS. 13A–13I depict a method for forming a multidie semiconductor package in accordance with teachings of the invention;

FIGS. 14A–14I depict another method for forming a multidie semiconductor package in accordance with the invention.

Dimensions of elements in the figures are not necessarily to scale in order to provide clarity in understanding. Like numerals are used to identify like elements throughout the drawings and description.

DETAILED DESCRIPTION OF THE INVENTION

Figure 2:
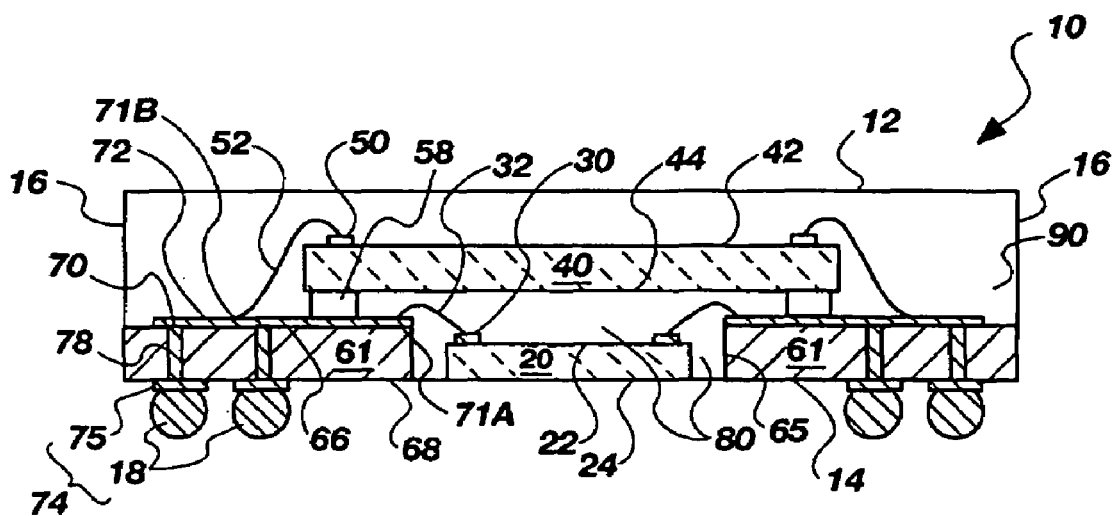
FIG. 2 is a cross-sectional side view of a multidie semiconductor device package in accordance with teachings of the present invention, as taken along line 2—2 of FIG. 1.

Referring to FIG. 1, a multichip semiconductor device package 10 according to the present invention is illustrated. As shown, FIG. 1 is an external view of the package 10 and is representative of a large number of possible device configurations exemplified in the figures following FIG. 1. Package 10 is illustrated as having an upper surface 12, a lower. surface 14, and peripheral edges 16. Outer connectors 18, shown here as solder balls in a ball grid array (BGA) connection pattern, are depicted as being on the lower surface 14 of the package 10 and attached to contact areas 9 on a representative carrier substrate 8. The dimensions of the package 10 include length 11, width 13 and thickness 15 (exclusive of the distance outer connectors 18 protrude from the lower surface 14). The outline of the encapsulated package 10, comprising length 11 and width 13 dimensions, defines the "footprint" of the package 10. The package 10 shown in FIG. 1 represents a multidie package which has been encapsulated in a mold.

FIG. 1A depicts another package configuration, in which the back side 44 of an upper semiconductor device 40 is left uncovered in the encapsulation step.

In FIG. 1B, another package configuration is shown with encapsulant 90 surrounding semiconductor device 40 and visibly extending to an interposer 61. The back side 44 of semiconductor device 40 is shown as uncovered but, of course, the encapsulation process may be operated to encase back side 44 as well.

FIG. 2 illustrates one embodiment of package 10 which depicts the upper surface 66 of interposer 61, including conductors 70, contact areas 71A and 71B, and traces 72. Also pictured is a first-level semiconductor device 20 positioned in receptacle 65 and having its bond pads 30 wirebonded by intermediate conductive elements 32 to contact areas 71A. The outline of a second-level semiconductor device 40 is also shown. The interposer 61 of package 10 is formed of a substantially planar substrate 60 having a receptacle 65 formed therein, i.e., extending from an upper surface 66 to a lower surface 68 of the substrate 60. The interposer 61 has conductors 70 on its upper surface 66 including traces 72 and contact areas 71A and/or 71B. The lower surface 68 is shown with conductors 74, including contact areas 75 to which outer connectors 18, e.g., balls, bumps, columns, pillars, or pins of conductive material (e.g., solder, another metal or metal alloy, conductive or conductor-filled elastomer, etc.), are attached. The upper surface conductors 70 and lower surface conductors 74 are depicted as being connected by conductive vias 78 in the form of microvias having a very small diameter, e.g., less than about 300 microns. Intermediate levels of conductors (not shown) may be provided within the interposer 61 and connected by conductive vias 78. The conductive vias 78 may be formed by photoimaging, laser ablation, plasma etching or the so-called "$B^2IT$" process, for example.

The substrate 60 of interposer 61 may be formed from either a rigid or flexible material. For example, the substrate 60 may be formed from silicon or another semiconductive material (e.g., gallium arsenide, indium phosphide, etc.), with at least some surfaces thereof being lined with an electrically insulative material to prevent shorting of the various electrical circuits running thereacross. Alternatively, other suitable interposer substrate materials may be used to form the substrate 60, including, without limitation, FR-4 resin, BT resin, ceramic, and polyimide. The substrate 60 may have a laminated structure comprising sublayers, or plies, of one or more materials.

Receptacles 65 may be part of the originally formed substrate 60, or may be subsequently formed by "routing" or by a photo, laser or plasma technique, for example. A large number of interposers 61 may simultaneously be formed in the format of a substrate sheet or strip 62 (FIG. 14F), and all receptacles 65 therein formed sequentially or substantially simultaneously.

In this discussion, the position of each semiconductor device relative to the interposer 61 will be noted as being at a "first-level," i.e., within the receptacle 65, at a "second-level," i.e., above the upper surface 66 of the interposer 61, or at a "third-level," i.e., below the lower surface 68 of the interposer 61. In addition, sublevels may exist within each level, each sublevel being occupied by a semiconductor device. Thus, a wide range of semiconductor device combinations may be achieved to meet a particular package's electronic footprint and thickness constraints for a particular purpose, whether that is for a microprocessor, memory device, or other purpose.

As depicted in FIG. 2, a first-level semiconductor device 20, or die, is positioned within receptacle 65 and generally coplanar with the interposer 61, having its active surface 22 facing upwardly. The back side 24 of the first-level semiconductor device 20 may be approximately coplanar with the lower surface 68 of the interposer 61 and may become part of the lower surface 14 of the package 10. Bond pads 30 on the active surface 22 of first-level semiconductor device 20 are electrically connected to contact areas 71A on the interposer 61 by intermediate conductive elements 32 (e.g., bond wires, conductive tape-automated bonding (TAB) elements carried by a dielectric, polymer film, thermocompression or ultrasonically bonded leads, etc.). The bond pads 30 of first-level semiconductor device 20 may be located on the active surface 22, either along a central axis of the semiconductor device 20 peripherally or otherwise, as known in the art.

A second-level semiconductor device 40 is positioned above the interposer 61 and attached thereto by an adhesive material 58 in the form of film, tape, or a flowable polymer, for example. The spacing between the second-level semiconductor device 40 and interposer 61 is maintained to accommodate intermediate conductive elements 52, minimize electrical interference between the second-level semiconductor device 40 and one or both of the first-level semiconductor device 20 and the interposer 61 to produce a low-profile package 10. The active surface 42 of second-level semiconductor device 40 has bond pads 50 which are shown connected to contact areas 71B by intermediate conductive elements 52.

As shown in FIG. 2, the package 10 is encapsulated in an insulating encapsulant material 90 by any suitable method. The package 10 as shown is typical of encapsulation by transfer molding, a process used widely in the semiconductor industry. Alternatively, pot molding or injection molding processes maybe used. The encapsulant 90 encloses the second-level semiconductor device 40, including its active surface 42 and intermediate conductive elements 52 attached to the interposer 61. The upper surface 66 of interposer 61 is also enclosed in encapsulant 90, as are interstitial spaces 80 between the semiconductor devices 20, 40 and the interposer 61.

The receptacle 65 may be formed somewhat centrally within the substrate 60 and is laterally confined by the material of the substrate 60. The receptacle 65 is configured to receive one or more first-level semiconductor devices 20 in such a manner that the active surface 22 of each semiconductor device is positioned for electrical attachment of the first-level semiconductor device 20 to the interposer 61. The receptacle 65 may be smaller in size than the second-level semiconductor device 40 in at least one dimension (length or width). Likewise, the first-level semiconductor device(s) 20 may have smaller footprints than the second-level semiconductor device(s) 40. The interstitial spaces 80 may be filled with an encapsulating material for supporting and protecting the first-level semiconductor device 20 and sealing the active surface 22 thereof.

In the embodiment of FIG. 2, interposer 61 includes contact areas 71A and 71B (e.g., contact pads) formed on the upper surface 66 thereof. Contact areas 71A are adjacent the receptacle 65 for wirebonding to bond pads 30 on the active surface(s) 22 of the first-level semiconductor device(s) 20. Each contact area 71B corresponds with and is configured to be electrically connected, via intermediate conductive elements 52, such as the depicted bond wires, conductive TAB elements carried by dielectric polymer film, thermocompression or ultrasonically bonded leads, or the like, to bond pads 50 on the active surface 42 of the second-level semiconductor device 40. Thus, the contact areas 71B are located outside of the second-level semiconductor device 40 to facilitate electrical connection to the intermediate conductive elements 52. The conductive elements 32, 52; bond pads 30, 50; contact areas 71A, 71B, 75; traces 72; and vias 78 may comprise, for example, aluminum, gold, silver, conductive alloys, or the like.

Conductive traces 72 extend substantially laterally from each contact area 71A, 71B, on or through the interposer 61, to corresponding conductors 70 arranged in an array over the upper surface 66 of the interposer 61. Generally, each conductor 70 communicates with a conductive via 78, which passes through the interposer 61 to contact area 75 on the lower surface 68 of the interposer 61. Outer connections 18, such as solder balls, are connected to the contact areas 75, enabling ready connection to contact areas (not shown) of a carrier substrate (not shown) (e.g., a circuit board, another semiconductor device, etc.).

Figure 2A:
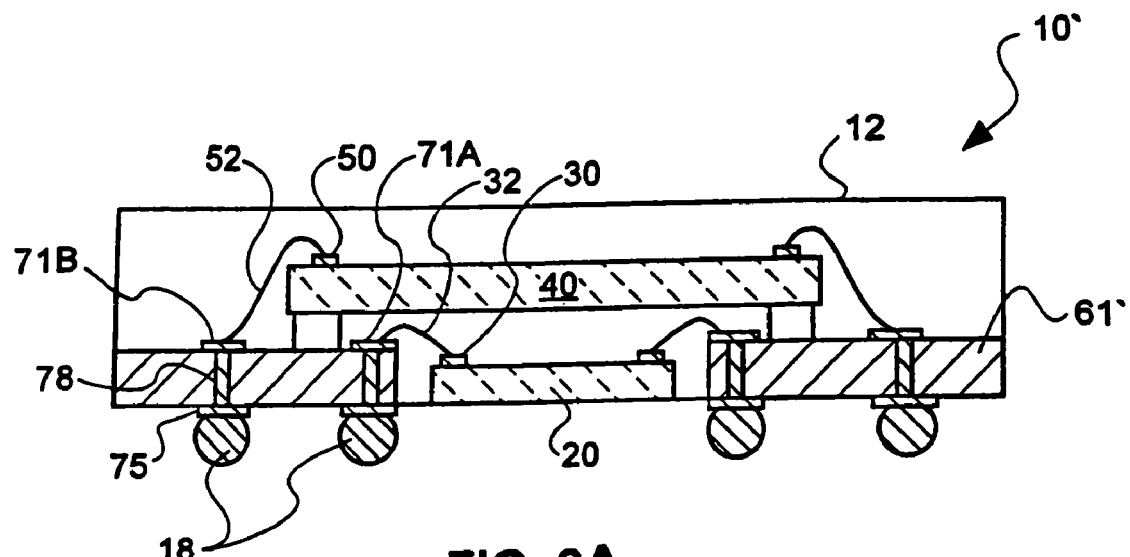
FIG. 2A is a cross-sectional side view of another embodiment of a multidie semiconductor device package in accordance with teachings of the present invention.
Figure 2B:
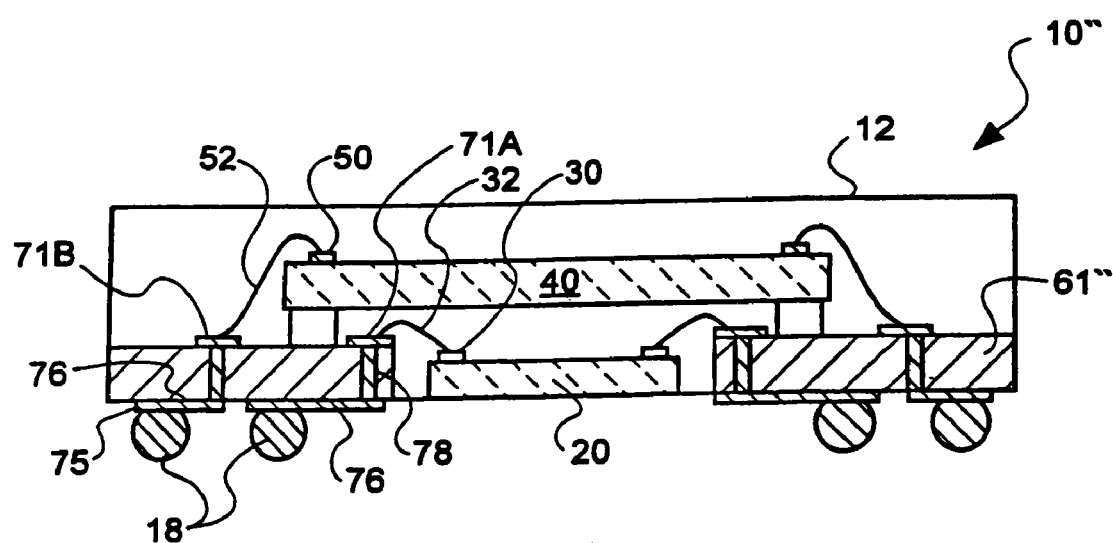
FIG. 2B is a cross-sectional side view of a further embodiment of a multidie semiconductor device package in accordance with teachings of the invention.

Some of the conductors 70 and corresponding conductive vias 78 may alternatively be positioned near the receptacle 65. As shown in FIG. 2A, a variation of the interposer 61' includes contact areas 71A and 71B that may directly overlie conductive vias 78. Thus, in a package 10' including interposer 61', the first-level semiconductor device 20 is connected to outer connectors 18, which are secured to contact areas 75 located at an opposite end of each conductive via 78 and which, therefore, lie directly below contact areas 71A and 71B. Alternatively, as depicted in FIG. 2B, another embodiment 10" of a package incorporating teachings of the present invention includes another variation of interposer 61". Interposer 61" includes conductive traces 76 on the lower surface 68 thereof, which may extend laterally outward from the conductive vias 78 to more peripherally located contact areas 75 to which outer connectors 18 are secured.

The outer connectors 18 are shown in the drawings as comprising solder balls or bumps. However, various conductive structures 18, such as columns, pillars, or other structures formed from a conductive material, such as solder, metal, or z-axis conductive elastomer including one or more discrete, anisotropically conductive regions, may be secured to contact areas 75 to facilitate communication between the plurality of semiconductor devices of the semiconductor device package 10 and a carrier substrate, another package or other apparatus.

As shown in FIG. 2, package 10 also includes a quantity of dielectric encapsulant material 90 within the interstitial space 80 adjacent the interposer 61 and first-level semiconductor device 20, in the space surrounding the second-level semiconductor device 40 and overlying the interposer 61. The encapsulant material 90 at least partially secures and laterally confines each first-level semiconductor device 20 within the receptacle 65 and secures and protects the second-level semiconductor device 40 (and any additionally mounted devices). Various methods for partial or complete encapsulation of multidie semiconductor package 10 are described hereinafter.

Figure 3:
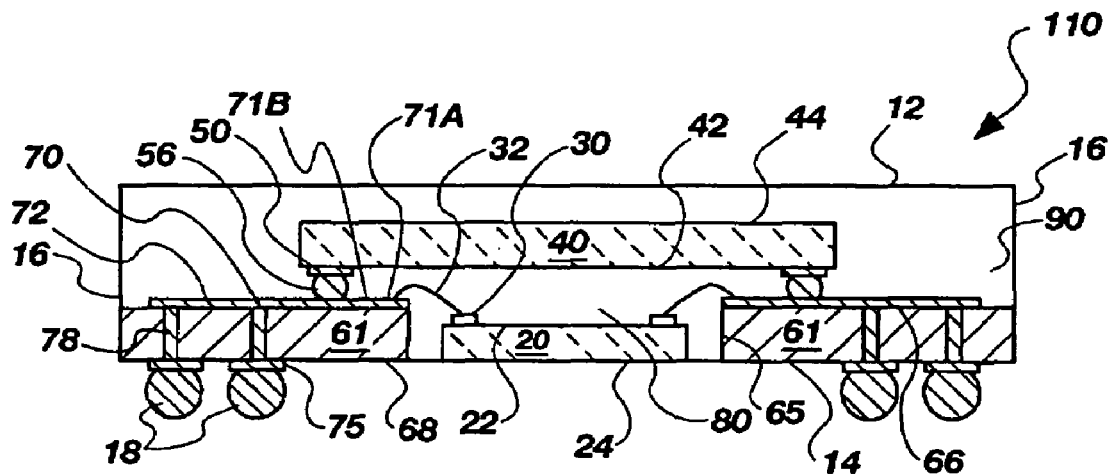
FIG. 3 is a cross-sectional side view of another multidie semiconductor device package formed in accordance with teachings of the invention, as taken along line 2—2 of FIG. 1.

FIG. 3 illustrates another embodiment of the multidie semiconductor device package 110. This embodiment differs from that of FIG. 2 in that the second-level semiconductor device 40 is mounted on interposer 61 in a flip-chip arrangement and is shown connected to contact areas 71B on the interposer by discrete conductive elements 56, balls, bumps, pillars, columns, or pins formed from conductive material, such as solder, conductive or conductor-filled elastomer, z-axis conductive elastomer, or the like. In other respects, this embodiment is similar to that of FIG. 2.

Configuring second-level semiconductor device 40 to be mounted in a flip-chip arrangement provides a package 110 with a reduced profile, inasmuch as intermediate conductive elements 52 are eliminated. Nevertheless, the package 110 is shown with encapsulant material 90 covering the second-level semiconductor device 40.

Figure 4:
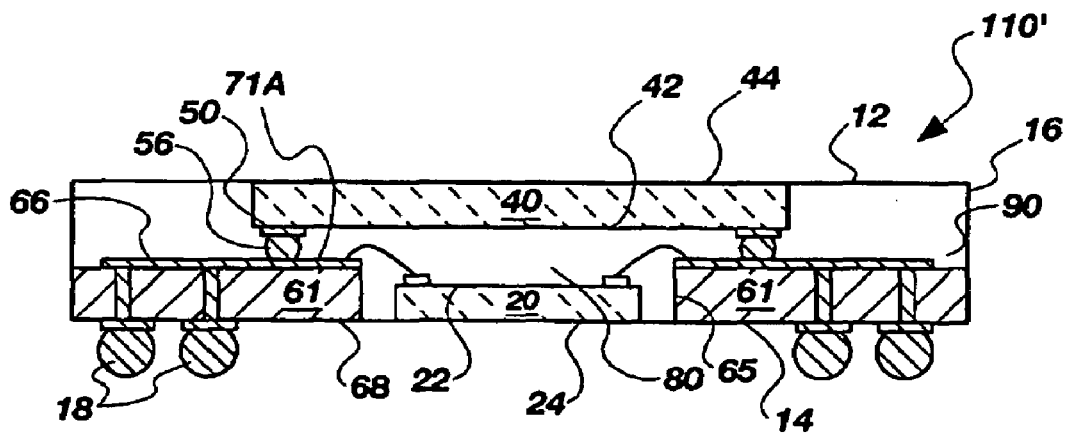
FIG. 4 is a cross-sectional side view of a further multidie semiconductor device package formed in accordance with the invention, as taken along line 2—2 of FIG. 1.

The package 110' of FIG. 4 differs from package 110 of FIG. 3 only in that the encapsulant material 90 is mold-applied to leave the back side 44 of the second-level semiconductor device 40 uncovered. For many applications, additional covering of the back side 44 is unnecessary; eliminating this encapsulant provides a further reduction in profile (package thickness 15 in FIG. 1).

Figure 5:
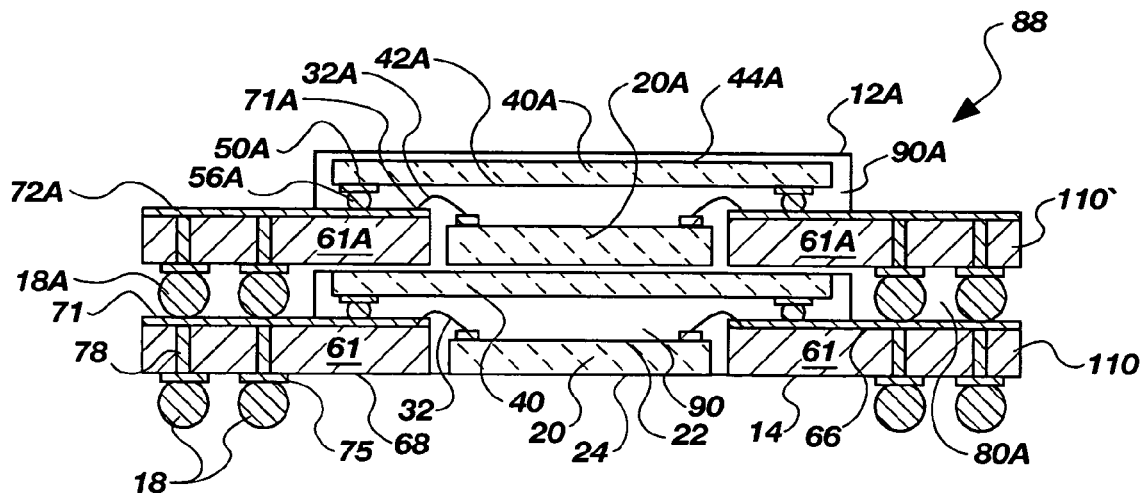
FIG. 5 is a cross-sectional side view of a stacked package of two multidie semiconductor device packages in accordance with teachings of the invention.

Another feature of the present invention is that two or more packages of the invention may be stacked to combine a larger number of semiconductor devices in a low-profile, small footprint manner. Shown in FIG. 5 are two packages 110, 110' having a configuration like that of FIGS. 3 and 4, except they are only partially encapsulated to leave room for outer connectors 18A between the packages 110, 110' and to leave outer connectors 18 exposed beneath package 110. The packages are joined in a package stack 88 by intermediate connectors 18A; e.g., solder balls of package 110' are joined to contact areas 71 on the upper surface 66 of the interposer 61 of lower package 110. The package stack 88 may be further encapsulated to enclose intermediate outer connectors 18A and fill interstitial spaces 80A between the packages 110 and 110'. Other intermediate connectors 18A may be used in place of solder balls, including bumps, columns, etc., as known in the art.

Figure 6:
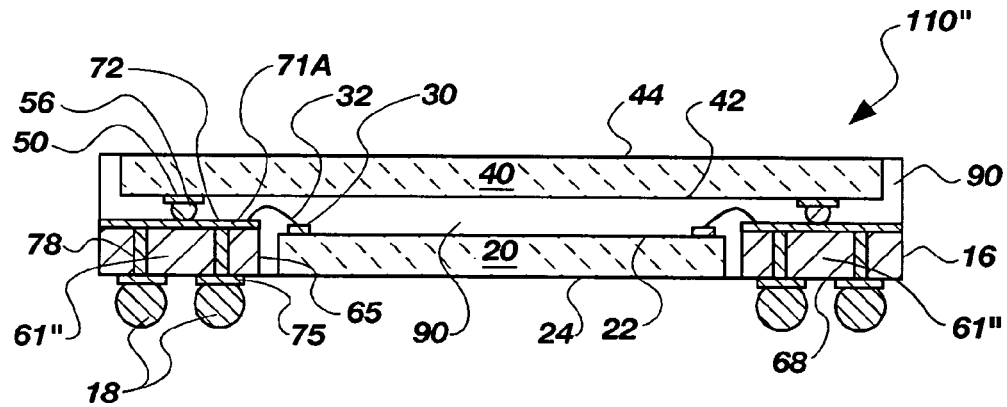
FIG. 6 is a cross-sectional side view of another multidie semiconductor device package formed in accordance with teachings of the invention, as taken along line 2—2 of FIG. 1.

FIG. 6 illustrates another embodiment of semiconductor device package 110" with a very low profile (i.e., a profile that is only slightly larger than the combined thicknesses of the stacked semiconductor devices 20, 40 thereof) and very small footprint (i.e., a footprint that is about the same as or only slightly larger than that of the second-level semiconductor device 40 thereof). In this package 110", the interposer 61" is configured to be only slightly larger than the second-level semiconductor device 40. This package 110" is particularly configured for use in miniature electronic apparatus of all types. The density of conducting elements in and on the interposer 61" is shown to be generally inversely proportional to the fraction of interposer area consumed by the receptacle 65.

Figure 7:
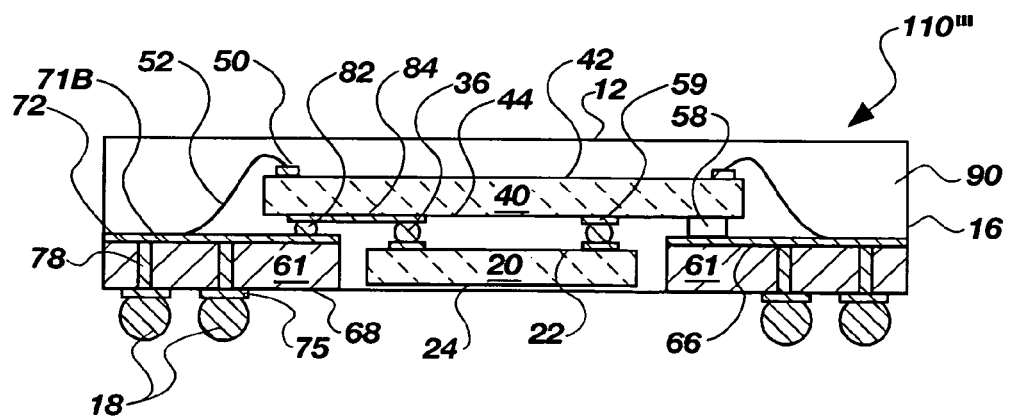
FIG. 7 is a cross-sectional side view of yet another embodiment of a multidie semiconductor package formed in accordance with the invention, as taken along line 2—2 of FIG. 1.

All of the packages discussed thus far include a first-level semiconductor device 20 which is electrically connected to an interposer by way of elongate intermediate conductive elements 32. In FIG. 7, an embodiment of package 110''' is depicted in which the first-level semiconductor device 20 is attached in flip-chip style to the back side 44 of the second-level semiconductor device 40 by way of solder balls 36 positioned between bond pads 30 of the first-level semiconductor device 20 and corresponding bond pads or other contact areas 59 on back side 44 of the second-level semiconductor device 40. Conductive traces 84 that are carried on the back side 44 of the second-level semiconductor device 40 extend from contact areas 59 toward an outer periphery of the second-level semiconductor device 40. Discrete conductive elements 82 electrically connect conductive traces 84 on the back side 44 of the second-level semiconductor device 40 to corresponding conductive traces 72 on the interposer 61. The second-level semiconductor device 40 is, in turn, electrically connected by elongate intermediate conductive elements 52 to contact areas 71B on the upper surface 66 of the interposer 61.

FIGS. 8, 9, 10, 11 and 12 depict variations of package 10 in which the semiconductor devices are all connected in flip-chip fashion, either to the interposer 61 or to each other.

Figure 8:
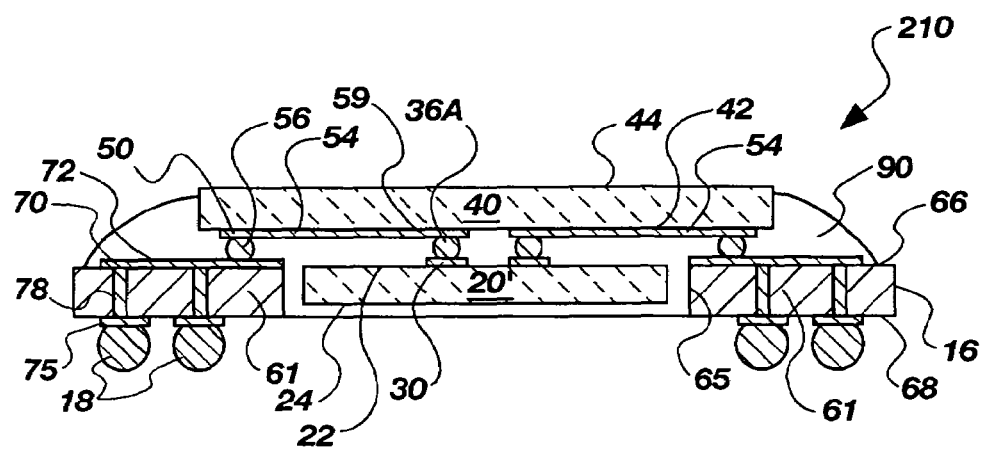
FIG. 8 is a cross-sectional side view of a further embodiment of a multidie semiconductor package formed in accordance with the invention.

In the package 210 of FIG. 8, bond pads 30 on the active surface 22 of a first-level semiconductor device 20' are attached to contact areas 59 on the active surface 42 of a second-level semiconductor device 40 by discrete conductive elements 36A, shown comprising conductive balls, although bumps, pillars, columns, regions of films, and other structures formed from metal, conductive or conductor-filled elastomer, or the like (e.g., an anisotropic or z-axis conductive film) could also be used. Conductive traces 54 on the active surface 42 of the second-level semiconductor device 40 connect the contact areas 59, via discrete conductive elements 56, traces 72, conductors 70 and conductive vias 78, to contact areas 75 and outer connectors 18. Bond pads 50 on the second-level semiconductor device 40 electrically communicate in a like manner with outer connectors 18. Although the first-level semiconductor device 20' in this example is shown with two centrally arranged rows of discrete conductive elements 36A, a semiconductor device 20' with peripherally located discrete conductive elements 36A may be used with a second-level semiconductor device 40 that has shorter conductive traces 54 extending over the active surface 42 thereof.

Figure 9:
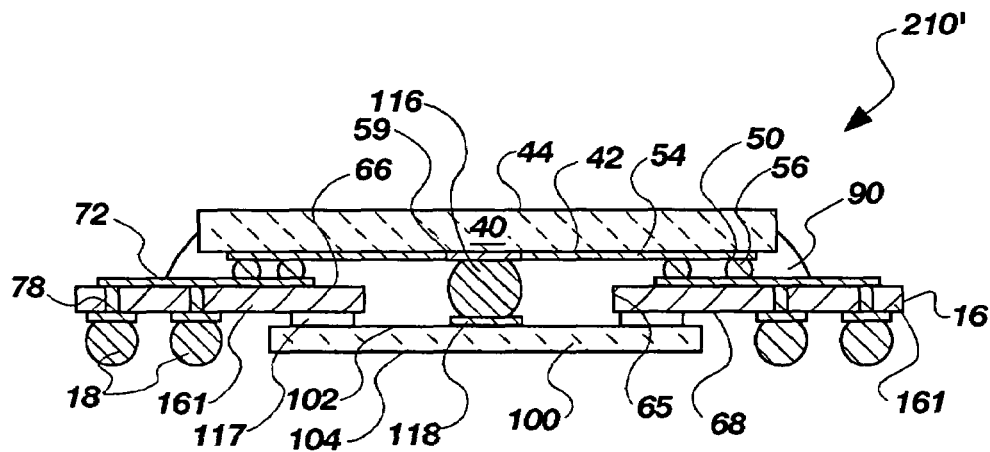
FIG. 9 is a cross-sectional side view of an additional embodiment of a multidie semiconductor package formed in accordance with the invention.

FIG. 9 depicts a package 210' which varies from the embodiments already described. In the package 210' of FIG. 9, a first-level semiconductor device 20 is not mounted within the interposer receptacle 65. Instead, a third-level semiconductor device 100 is mounted with an active surface 102 thereof facing upward toward the receptacle 65 and the lower surface 68 of the interposer 161 and secured to the lower surface 68 with adhesive material 117. Bond pads 118 on the third-level semiconductor device 100 are shown connected to the active surface 42 of the second-level semiconductor device 40 by discrete conductive elements 116. The back side 104 of third-level semiconductor device 100 is shown uncovered, but may be encapsulated. In FIG. 9, the interposer 161 is shown as being formed from a flexible or so-called "flex" substrate material of a known type, which typically has a reduced thickness relative to rigid substrates.

Figure 10:
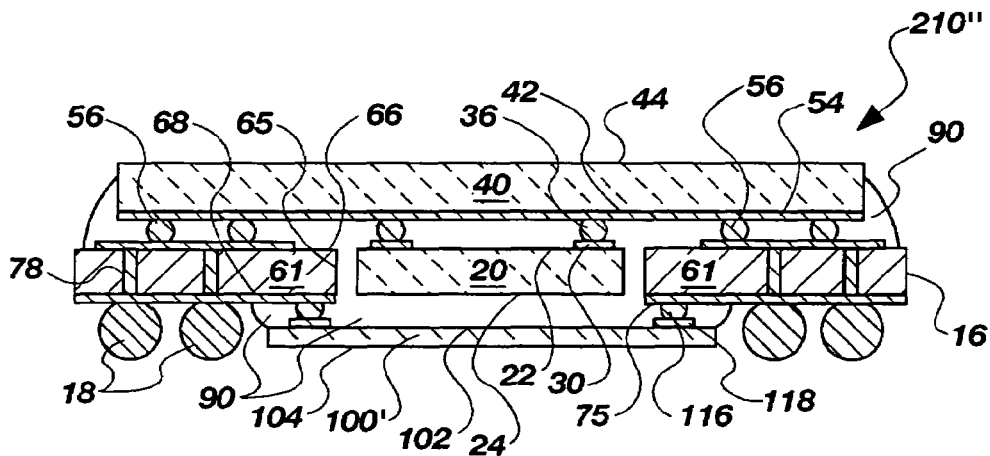
FIG. 10 is a cross-sectional side view of a multidie semiconductor package formed of three devices in accordance with the invention.

FIG. 10 shows a multidie package 210" which combines features of the packages 210, 210' of FIGS. 8 and 9, respectively. A first-level semiconductor device 20 is positioned within receptacle 65 and attached, flip-chip style, to a second-level semiconductor device 40 positioned above the interposer 61. The bond pads of semiconductor device 20 and, thus, the discrete conductive elements 36 may be arranged either peripherally, as shown, or centrally on first-level semiconductor device 20. The second-level semiconductor device 40 is attached in a flip-chip manner to the upper surface 66 of the interposer 61, whereby discrete conductive elements 56 communicate signals from both the first-level and second-level semiconductor devices 20, 40 to the interposer 61 and, thence, to outer connectors 18.

A third-level semiconductor device 100' is attached, flip-chip style, to the lower surface 68 of interposer 61. Peripherally located bond pads 118 on semiconductor device 100' are connected to contact areas 75 of the interposer 61 by discrete conductive elements 116 such as balls, bumps, pillars, or columns of conductive material, such as metal or conductive or conductor-filled elastomer, or electrically distinct regions of an anisotropically or z-axis conductive film. Conductive traces 76 between contact areas 75 and outer connectors 18 complete the package circuit. It should be noted that the size of outer connectors 18 is selected so that the connectors extend sufficiently beyond the back side 104 of the third-level semiconductor device 100, whereby a well-bonded connection to a carrier substrate 8 is achieved.

Figure 11:
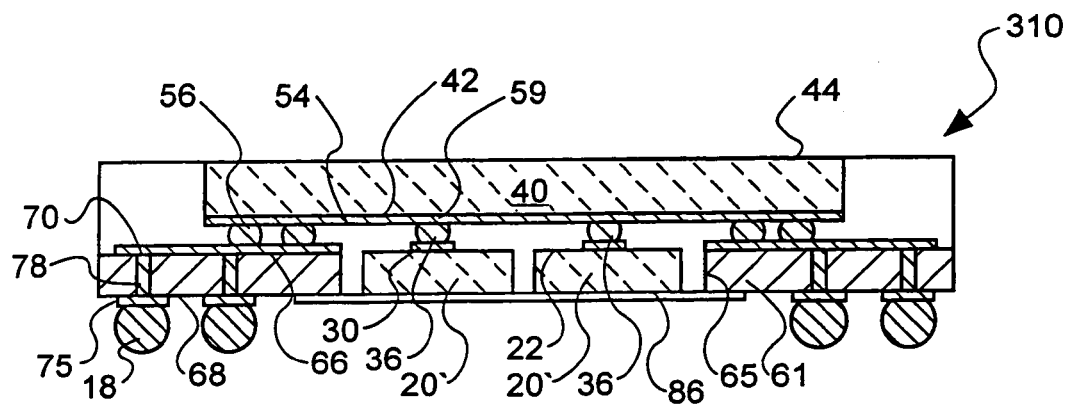
FIG. 11 is a cross-sectional side view of a further embodiment of a multidie semiconductor package formed of three devices in accordance with the invention.
Figure 12:
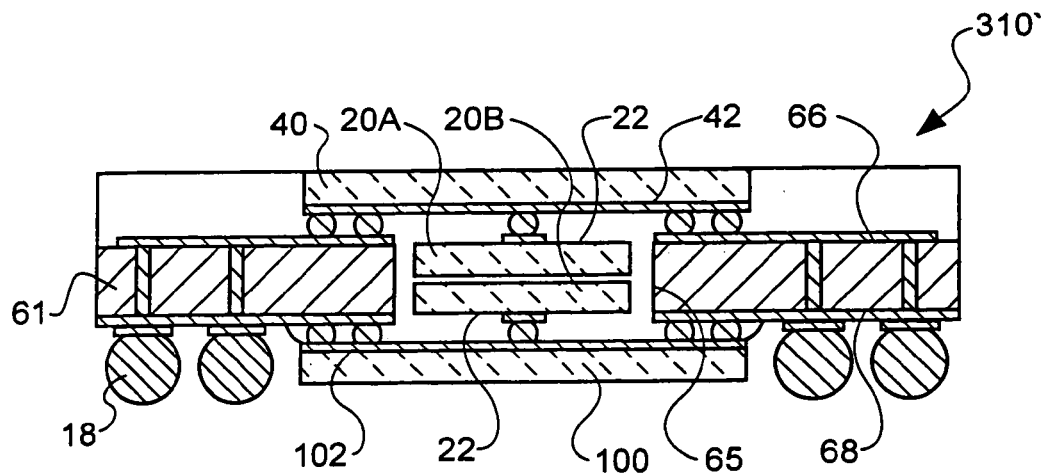
FIG. 12 is a cross-sectional side view of a multidie semiconductor package formed of four semiconductor devices in accordance with a method of the invention.

Turning now to FIGS. 11 and 12, exemplary modes of using a plurality of first-level semiconductor devices 20 in a package 10 are illustrated.

In FIG. 11, an embodiment of a package 310 is depicted in which two or more first-level semiconductor devices 20' are positioned side-by-side within an interposer receptacle 65. The bond pads 30 of each semiconductor device 20' are flip-chip bonded by discrete conductive elements 36 to corresponding contact areas 59 on the active surface 42 of a second-level semiconductor device 40. Like the embodiments of FIGS. 8, 9 and 10, the second-level semiconductor device 40 is flip-chip bonded to the upper surface 66 of the interposer 61. FIG. 11 also illustrates an assembly structure 86, such as a film, which may be attached to the lower surface 68 of the interposer 61, covering the receptacle 65 before positioning and attaching the first-level semiconductor devices 20' in the receptacle 65. This feature is useful in assembling packages where the first-level semiconductor devices 20' are first mounted in the receptacle 65 of the interposer 61, followed by attachment of the second-level semiconductor device 40 to the interposer 61 and the first-level semiconductor devices 20'. The assembly structure 86 may be temporarily or permanently attached to hold one or more first-level semiconductor devices 20' in place prior to and while electronically connecting the same to the interposer 61. The assembly structure 86 may subsequently be removed.

The embodiment of semiconductor device package 310' shown in FIG. 12 includes a second-level semiconductor device 40 and a third-level semiconductor device 100 that are attached, flip-chip style, to the upper surface 66 and lower surface 68, respectively, of the interposer 61, as previously described. Within the interposer receptacle 65 are two first-level semiconductor devices 20A and 20B, one above the other. The upper first-level semiconductor device 20A is attached flip-chip style to the active surface 42 of the second-level semiconductor device 40. The lower first-level semiconductor device 20B is attached, flip-chip style, to the active surface 102 of the third-level semiconductor device 100.

In each of the figures, it is understood that the semiconductor devices (e.g., semiconductor devices 20, 40, 100, etc.) may include insulative layers (not shown) which separate electrical conductors, such as the conductive traces of redistribution layers, from each other and from other adjacent components of a package. These layers may be in the form of deposited films or preformed adhesive films that have been adhesively or otherwise secured to the semiconductor devices.

A package of the present invention which comprises two stacked semiconductor devices may have a total thickness of less than about 1 mm, making the package suitable for use in compact electronic devices, such as cellular telephones, handheld computers, and portable computers, where such low-profile packages are required or desired. In addition, the package may be formed to provide a very small footprint, e.g., about the same size as or only slightly larger than that of the second-level semiconductor device.

Several useful methods for assembling packages in accordance with teachings of the present invention are illustrated in FIGS. 13, 14 and 15.

FIGS. 13A–13I depict a method for assembling a multidie semiconductor device package such as that pictured in FIGS. 2, 2A, and 2B, for example. As shown in FIG. 13A, a plurality of first-level semiconductor devices 20 is prepared on an active surface 22 of a wafer 26 or other suitable semiconductor substrate, such as a substrate formed from gallium arsenide, indium phosphide, or another semiconductive material or a so-called silicon-on-insulator (SOI) type substrate (e.g., silicon-on-glass (SOG), silicon-on-ceramic (SOC), silicon-on-sapphire (SOS), etc.). Each semiconductor device 20 typically comprises semiconductor material with internal electronic functions and a plurality of bond pads (not shown) on the active surface 22. The wafer 26 is cut along saw lines 28, as depicted in FIG. 13B, to produce individual singulated first-level semiconductor devices 20.

Likewise, as illustrated in FIG. 13C, a plurality of second-level semiconductor devices 40 is fabricated on an active surface 42 of a wafer 46 or other semiconductor substrate. These second-level semiconductor devices 40 will generally be larger in footprint than the first-level semiconductor devices 20. The wafer 46 is then cut along saw lines 48 into individual singulated second-level semiconductor devices 40, as shown in FIG. 13D.

In addition, as depicted in FIG. 13E, a plurality of interposers 61 is formed from an interposer substrate material 60. The interposer substrate 60 may be in the form of a multi-interposer sheet or strip, which is referred to herein as "sheet/strip 62," as represented in FIG. 13E, with an upper surface 66 and a lower surface 68. On one or both of the upper surface 66 and the lower surface 68 include metallization, including bond pads, contact areas, conductive traces, and/or the like, and conductive vias for vertical interconnection (not shown). Cut lines 64 are located between adjacent, individual interposers 61 of the sheet/strip 62 and form boundaries therebetween. Each interposer 61 includes a generally centrally positioned receptacle 65 formed at least partially therethrough, into which one or more first-level semiconductor devices 20 may be positioned and mounted. An assembly structure 86, such as film, may be temporarily or permanently attached to the lower surface 68 of each interposer 61 to cover the opening of the receptacle 65 thereof.

Turning now to FIG. 13F, a first-level semiconductor device 20 may be placed in each receptacle 65. The first-level semiconductor device 20 may then be electrically connected to the interposer 61 by way of intermediate conductive elements 32. This may occur prior to separation of adjacent interposers 61 from sheet/strip 62, as shown, or following separation of the interposers 61 from sheet/strip 62.

Next, as shown in FIG. 13G, individual second-level semiconductor devices 40 are positioned over each receptacle 65 containing a wire-bonded first-level semiconductor device 20. Each second-level semiconductor device 40 is attached to the upper surface 66 of the interposer. 61 by a dielectric adhesive material 58, such as KAPTON® tape, for example. Intermediate conductive elements 52 may then be positioned or formed between bond pads (not shown) of the second-level semiconductor device 40 and corresponding contact areas (not shown) of the interposer 61.

As shown in FIG. 13H, encapsulation of an assembly such as that shown in FIG. 13G may be accomplished by a variety of different methods. For example, known transfer molding or pot molding processes may be used. Depending upon the particular package configuration, a preliminary step of permitting a liquid encapsulant to substantially backfill the interstitial spaces between the interposer 61 and semiconductor devices 20, 40, followed by thermal curing, will strengthen the device mounting and seal the inner spaces, enabling removal of assembly structure 86, if such is desired.

For encapsulation of packages 10 in this invention, a suitable, known type of encapsulant material 90 (e.g., a filled polymer transfer molding compound or a silicone or epoxy-type glob-top type encapsulant material) is introduced into the remaining interstitial spaces 80 within receptacle 65 of each interposer 61 of the sheet/strip 62. The encapsulant material 90 extends laterally between at least portions of the outer periphery of each first-level semiconductor device 20 within the receptacle 65 and the interstitial space 80 between the second-level semiconductor device 40 and the interposer 61. The encapsulant material 90 may also substantially cover the intermediate conductive elements including all bond pads, bond wires, intermediate connectors, contact areas, and traces. Accordingly, the encapsulant material 90 may substantially fill the remaining space within receptacle 65 and at least partially cover the active surface 22, 42, 102 of each semiconductor device 20, 40, 100 as well as the regions of the upper surface 66 of the interposer 61 at which metallization areas are located.

Once the encapsulant material 90 has been introduced into the receptacle 65 and interstitial spaces 80, it is permitted or caused to harden, set, or cure. For example, if a thermoplastic resin is used as the encapsulant material 90, the encapsulant material will harden upon cooling of the same. If a transfer molding compound or other resin is used as the encapsulant material 90, the encapsulant material may be cured by the addition of a catalyst or by applying heat and/or pressure to the same. If the encapsulant material 90 is a photoimageable polymer, the encapsulant material may be set or cured by exposing the same to an appropriate wavelength of radiation.

As depicted in the figures, when encapsulant material 90 has hardened, set, or cured, the encapsulant material 90 holds the one or more first-level semiconductor devices 20 within the receptacle 65. Accordingly, an assembly structure or film 86 (FIG. 11) may be removed from the lower surface 68 of each interposer 61, with each first-level semiconductor device 20 being suspended in the receptacle 65 of that interposer 61 and the back side 24 of each first-level semiconductor device 20 within the receptacle 65 being exposed. An exemplary encapsulation of the assembly 86 with an encapsulant material 90 in a transfer mold or pot mold may be used to form interconnected packages 10 of uniform size, as illustrated, or separate packages 10 that include previously separated interposers 61.

Outer connectors 18 such as balls, bumps, columns, pillars, or pins of metal or another conductive material (e.g., a conductive or conductor-filled elastomer) may be attached to contact areas of the lower surface 14 of the package 10, i.e., lower surface 68 of the interposer 61. The installation may be performed either before or after encapsulation and before or after singulation into individual packages 10, as shown in FIG. 13I. Singulation may be accomplished by use of a wafer saw or otherwise, as known in the art.

Another example of a method of the present invention, depicted in FIGS. 14A–14I, is applicable to the packages shown in FIGS. 7, 8, 9, 10, 11, and 12, for example. A package formed by this method has the first-level semiconductor device 20 connected in a flip-chip manner to a second-level semiconductor device 40.

As shown in FIG. 14A, a plurality of first-level semiconductor devices 20 is prepared on an active surface 22 of a wafer 26 or other semiconductor substrate. The wafer 26 is then cut along saw lines 28, as depicted in FIG. 14B, to produce singulated first-level semiconductor devices 20. Discrete conductive elements 36, such as balls, bumps, columns, pillars, pins, or the like, are formed secured to bond pads (not shown) of each first-level semiconductor device 20 for connection thereof to second-level semiconductor devices 40. The discrete conductive elements 36 may be attached to the bond pads of first-level semiconductor devices 20 either before or after singulation.

FIG. 14C depicts preparation of a plurality of second-level semiconductor devices 40 on a wafer 46 or other semiconductor substrate as described in reference to FIG. 13C.

As shown in FIG. 14D, a first-level semiconductor device 20 is flip-chip bonded, by discrete conductive elements 36 (not shown), to the active surface 42 of each second-level semiconductor device 40 on wafer 46. Metallization (not visible) on the active surface 42 of wafer 46 connects the circuits (not visible) of both semiconductor devices 20, 40 of each two-die unit 94 (FIG. 14E) to peripheral discrete conductive elements 56, e.g., solder balls on each second-level semiconductor device 40. Wafer 46 may be cut along saw lines 48 to singulate the two-die units 94, each of which comprises a first-level semiconductor device 20 flip-chip bonded to a second-level semiconductor device 40, as shown in FIG. 14E. Alternatively, wafer 46 may be severed prior to securing or electrically connecting first-level semiconductor devices 20 to second-level semiconductor devices 40.

In FIG. 14F, a plurality of interposers 61 is shown, formed with a substrate material 60, which may comprise a sheet or strip 62 of rigid or flexible substrate material. Receptacles 65 are formed in each interposer 61 and may be located generally centrally thereon. The multi-interposer substrate sheet or strip 62 is shown in an inverted orientation, wherein outer connectors 18 are visible on the lower surface 68 of the interposer 61. Metallization (not visible), including traces 72 and contact areas 71 on the upper surface 66 of the substrate sheet or strip 62, is electrically connected to outer connectors 18 on the lower surface 68 of the interposer 61.

As shown in FIG. 14G, the two-die units 94 are attached to interposers 61 of sheet/strip 62 by flip-chip connection of the second-level semiconductor devices 40 to the interposers 61, with the first-level semiconductor devices 20 being received by receptacles 65 of the interposers 61. As shown, first-level semiconductor devices 20 project upwardly through the receptacles 65 of the inverted interposers 61. Each first-level semiconductor device 20 and second-level semiconductor device 40 communicates with outer connectors 18 through the intermediate conductors (bond pads, contact areas, solder balls and vias, etc.).

The assemblies shown in FIG. 14G may be collectively or individually encapsulated as shown in FIG. 14H by introducing encapsulant material 90 into the interstitial spaces 80 within receptacles 65 and underlying the second-level semiconductor device 40, which is not visible in FIG. 14H. In addition, encapsulant material 90 may cover the upper surface 66 of the interposer 61, surrounding exposed portions of the second-level semiconductor device 40. The package 10 which is illustrated in FIG. 14I is typical of packages formed by transfer molding and may include encapsulation of the interposer edges 69 (FIG. 14G) as well. Each package 10 may be singulated from the multi-interposer substrate sheet or strip 62 by cutting along lines 64 either following encapsulation, as shown in FIGS. 14H and 14I, or prior to encapsulation. The packages 10 are ready for testing and attachment to a carrier substrate 8, another package, or other apparatus.

It may be noted that the outer connectors 18 may be attached to the interposer's lower surface 68 either prior to or following attachment and electrical connection of the semiconductor devices 20 and 40 to the interposer 61.

Figure 15A:
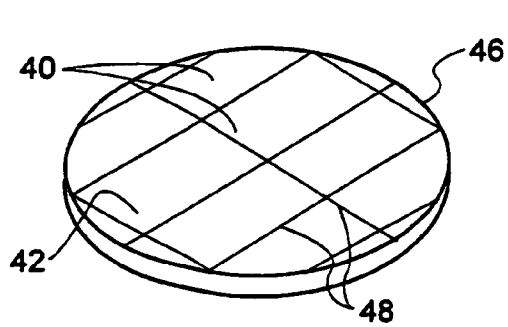
FIGS. 15A–15K depict yet another method for forming a multidie semiconductor package in accordance with the invention.
Figure 15B:
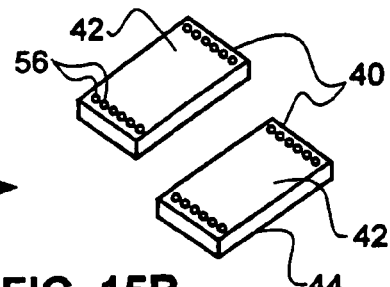

Another exemplary method for assembly of a package 10 in accordance with the teachings of the present invention is illustrated in FIGS. 15A–15K. As shown in FIG. 15A, a plurality of second-level semiconductor devices 40 is fabricated on an active surface 42 of a wafer 46 or other semiconductor substrate. Individual second-level semiconductor devices 40 are delineated by saw lines 48 on the wafer 46. In FIG. 15B, wafer 46 is cut along saw lines 48 into individual second-level semiconductor devices 40. Discrete conductive elements 56 are placed on bond pads (not shown) on the active surface 42 while the second-level semiconductor devices 40 remain part of wafer 46 or following singulation of second-level semiconductor devices 40 from the wafer 46.

Figure 15C:
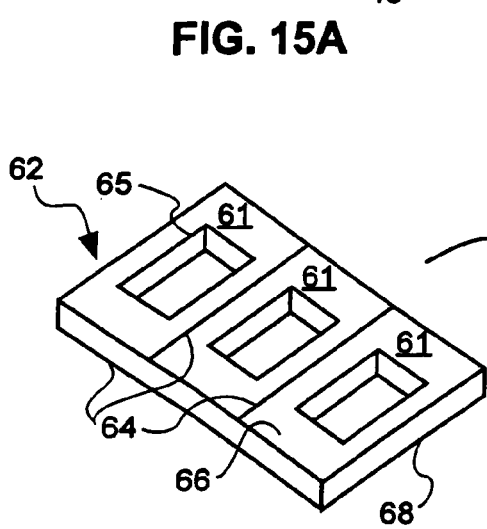

As depicted in FIG. 15C, a plurality of interposers 61 is formed with substrate material 60 in the form of a multi-interposer sheet or strip 62. The sheet/strip 62 is formed of suitable material 60 of any desired rigidity or flexibility. The sheet/strip 62 has an upper surface 66 and a lower surface 68. A receptacle 65 is formed in each interposer 61, extending between the upper and lower surfaces 66 and 68.

Figure 15D:
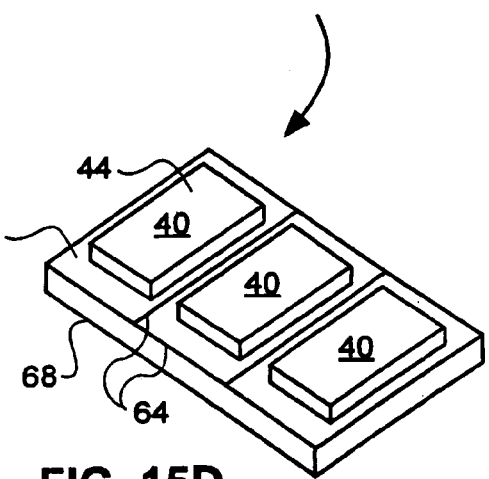
Figure 15E:
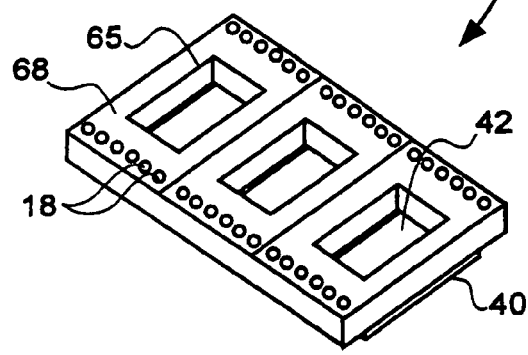

Once interposers 61 and second-level semiconductor devices 40 have been fabricated, second-level semiconductor devices 40 are mounted, flip-chip style, to the upper surface 66 of each interposer 61 of the sheet/strip 62, with each second-level semiconductor device 40 at least partially covering a receptacle 65, as depicted in FIG. 15D. The sheet/strip 62 is shown in FIG. 15E in an inverted orientation. Outer connectors 18 protrude visibly from the lower surface 68 of each interposer 61. These outer connectors 18 may be applied to the sheet/strip 62 either before or after attachment and/or electrical connection of the second-level semiconductor devices 40 thereto.

Figure 15F:
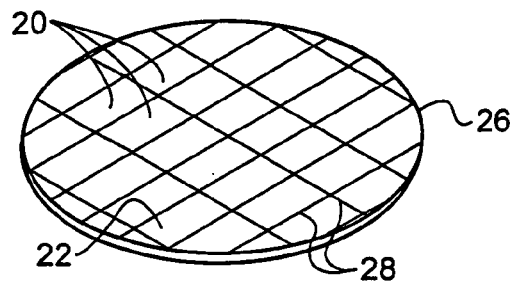

Continuing the assembly process, as shown in FIG. 15F, a plurality of first-level semiconductor devices 20 is formed on an active surface 22 of wafer 26 or other semiconductor substrate, as previously described with reference to FIG. 13A. Discrete conductive elements 36 are attached to bond pads (not shown) on the active surfaces 22 of the first-level semiconductor devices 20. Next, as illustrated in FIG. 15G, the wafer 26 is cut along saw lines 28 to singulate first-level semiconductor devices 20 from one another.

Figure 15H:
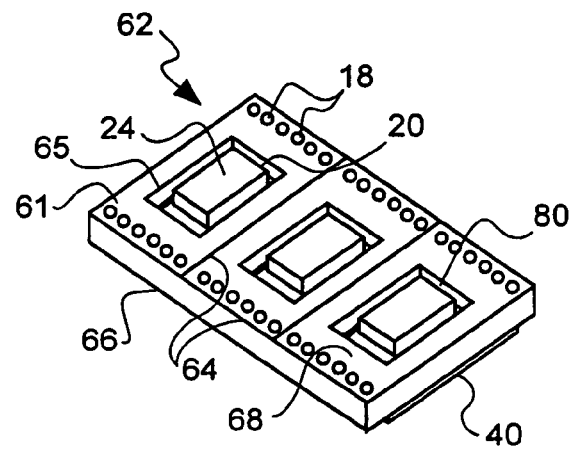
Figure 15G:
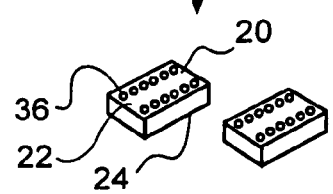
Figure 15J:
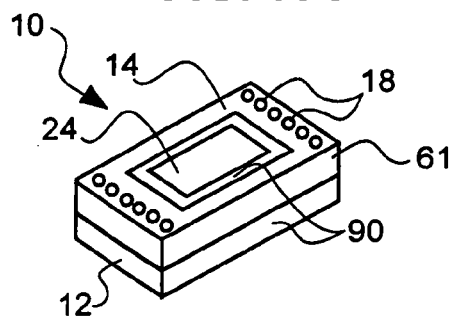

Turning now to FIG. 15H, first-level semiconductor devices 20 are inverted, positioned at least partially within receptacles 65 of interposers 61, and bonded, flip-chip style, to the active surfaces 42 (not shown) of the second-level semiconductor devices 40. Interstitial spaces 80 are located around each first-level semiconductor device 20, between semiconductor devices 20 and 40, and between semiconductor devices 20, 40 and the interposers 61.

Figure 15I:
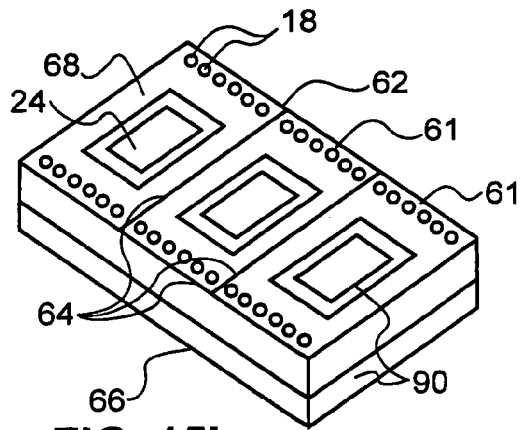
Figure 15K:
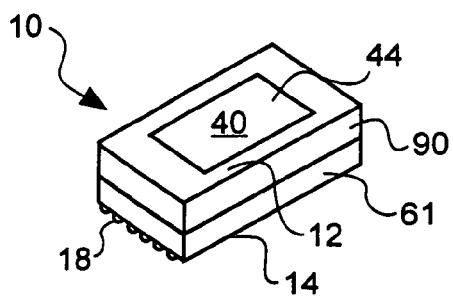

As shown in FIG. 15I, encapsulant material 90 may be introduced into interstitial spaces 80, as well as around second-level semiconductor devices 40.

The encapsulated structure of FIG. 15I may be cut along cut lines 64 to form singulated packages 10. Alternatively, singulation may be effected prior to encapsulation. Each package 10 includes an upper surface 12 and a lower surface 14, which are identified in the respective upper and lower views of package 10 of FIGS. 15J and 15K. The packaging configuration is typical of that produced by known transfer molding or pot molding processes. Optionally, the encapsulation step may be configured to cover the exposed back sides of second-level semiconductor device 40 and/or first-level semiconductor device 20. Optionally, any bare edges of the interposer, i.e., those exposed at cut lines 64, may be covered by an encapsulant in a subsequent step. The edges may be covered by an encapsulant, e.g., glob top, at the time that the package 10 is mounted on a carrier substrate.

Where additional semiconductor devices, e.g., semiconductor device 100, are to be mounted on an interposer 61, relevant portions of the described methods may be repeated for each semiconductor device or device combination to achieve the desired package configuration.

With returned reference to FIG. 5; formation of package stacks 88 requires a further step of bonding or otherwise securing packages 10 to each other. Further encapsulation may be performed to enclose outer connectors 18A of the upper package(s) 110'.

While the above methods are illustrated with the outer connectors 18 arranged in BGA connection patterns, other arrangements and types of conductive elements may also be used to connect a package 10 to a carrier substrate 8, another package or other apparatus. For example, bumps, columns, bonded leads or tape-automated bond (TAB) elements may be used, as may plug-in type connectors and others known in the art. Likewise, other types of discrete conductive elements 36, 56, 116 may be used to connect semiconductor devices 20, 40, 100 to each other or to the interposer 61.

The overall thickness of the resulting semiconductor device package 10 is substantially equal to the combined thicknesses of the interposer 61 and the second-level semiconductor device 40, and the distance of outer connectors 18 from the lower surface 68 of interposer 61. The thickness of a third-level semiconductor device 100 does not contribute to the overall package thickness, being positioned between the outer connectors 18.

While the figures depict the inventive process using a substrate sheet/strip 62 having a plurality of physically connected interposers 61, each interposer 61 having a single receptacle 65 with one or more first-level semiconductor devices 20 mounted therein, it will be understood that the process is applicable to any interposer 61 with a receptacle 65 extending substantially therethrough, including an interposer 61 having more than one receptacle 65.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for assembling a multidie semiconductor device package, comprising:

providing an interposer with a substantially planar substrate and a receptacle formed substantially through the substrate, the substrate having an upper surface and a lower surface, at least the upper surface having conductors thereon;

positioning at least one first-level semiconductor device within the receptacle, a backside of the at least one first-level semiconductor device being substantially coplanar with the lower surface of the substrate or located within a plane which extends through the substrate an interstitial space remaining at least between peripheral edges of the at least one first-level semiconductor device and the substrate;

positioning a second-level semiconductor device above the upper surface of the substrate, a portion of the second-level semiconductor device superimposed with the upper surface of the substrate;

electrically connecting the at least one first-level semiconductor device to at least the conductors on the upper surface of the substrate by first-level conductive members that include laterally extending portions that are at least partially carried by a surface of the second-level semiconductor device; and electrically connecting the second-level semiconductor device to the conductors on the upper surface of the substrate by second-level conductive members.

2. The method of claim 1, further comprising introducing a quantity of encapsulant material into the receptacle so as to fill at least a portion of the interstitial space.

3. The method of claim 2, wherein the introducing encapsulant material is effected after the electrically connecting the at least one first-level semiconductor device.

4. The method of claim 2, further comprising introducing a quantity of encapsulant material between the second-level semiconductor device and the at least one first-level semiconductor device.

5. The method of claim 2, further comprising adhering a film to the lower surface of the substrate to cover at least a portion of the receptacle prior to positioning the at least one first-level semiconductor device therein.

6. The method of claim 5, further comprising removing the adhered film from the lower surface following curing of the encapsulant material in the receptacle.

7. The method of claim 1, wherein electrically connecting the at least one first-level semiconductor device comprises forming or positioning intermediate conductive elements between bond pads of the at least one first-level semiconductor device and corresponding conductors of the interposer.

8. The method of claim 1, wherein electrically connecting the second-level semiconductor device comprises forming or positioning intermediate conductive elements between bond pads of the second-level semiconductor device and corresponding conductors of the interposer.

9. The method of claim 1, wherein positioning the second-level semiconductor device comprises at least one of positioning the second-level semiconductor device in a flip-chip arrangement over the at least one first-level semiconductor device and positioning the second-level semiconductor device over the interposer.

10. The method of claim 9, further comprising securing the at least one first-level semiconductor device and the second-level semiconductor device to one another before the positioning the second-level semiconductor device.

11. The method of claim 1, wherein the providing the interposer comprises providing a multi-interposer substrate on which the at least one first-level semiconductor device and the second-level semiconductor device are positioned and electrically connected.

12. The method of claim 11, further comprising singulating individual assemblies or packages from the multi-interposer substrate.

13. The method of claim 1, further comprising positioning another first-level semiconductor device within the receptacle, a backside of the another first-level semiconductor device facing the backside of the at least one first-level semiconductor device.

14. The method of claim 13, further comprising electrically connecting bond pads of the another first-level semiconductor device to corresponding conductors on the lower surface of the substrate.

15. The method of claim 13, further comprising positioning a third-level semiconductor device over the lower surface of the substrate.

16. The method of claim 15, further comprising electrically connecting bond pads of the another first-level semiconductor device to corresponding bond pads of the third-level semiconductor device.

17. The method of claim 15, further comprising electrically connecting bond pads of the third-level semiconductor device to corresponding conductors on the lower surface of the substrate.

18. A method for assembling semiconductor device components, comprising:

providing an interposer with a substantially planar, substantially rigid substrate and a receptacle formed substantially through the substrate;

positioning a first semiconductor device over a first surface of the interposer, at least one bond pad of the first semiconductor device being exposed to the receptacle;

positioning a second semiconductor device over a second surface of the interposer, at least one bond pad of the second semiconductor device being exposed to the receptacle; and electrically connecting the at least one bond pad of the first and second semiconductor devices through the receptacle; and electrically connecting at least the first semiconductor device to the interposer, at least a laterally extending portion of one conductive element carried by a surface of the first semiconductor device, also facilitating electrical connection of the second semiconductor device to the interposer upon electrically connecting the at least the first semiconductor device thereto.

19. The method of claim 18, wherein electrically connecting includes securing a conductive structure to the at least one bond pad of the first semiconductor device or to the at least one bond pad of the second semiconductor device.

20. The method of claim 19, wherein securing is effected before positioning.

21. The method of claim 19, wherein securing is effected following positioning.

22. The method of claim 18, wherein positioning the first semiconductor device comprises positioning the first semiconductor device with the at least one bond pad exposed to the receptacle comprising a portion of a redistribution circuit on a surface of the first semiconductor device.

* * * * *

UNITED STATES PATENT AND TRADEMARK OFFICE
CERTIFICATE OF CORRECTION

| | |
|---|---|
| PATENT NO. | : 7,198,980 B2 |
| APPLICATION NO. | : 10/706576 |
| DATED | : April 3, 2007 |
| INVENTOR(S) | : Jiang et al. |

It is certified that error appears in the above-identified patent and that said Letters Patent is hereby corrected as shown below:

On the face page, in field (56), under "U.S. Patent Documents", in column 2, line 3, below "5,977,640 A * 11/1999 Bertin et al. 257/777" insert -- 5,998,859  7/1999 Griswold et al. --.

Signed and Sealed this

Twenty Second Day of April, 2008

JON W. DUDAS
*Director of the United States Patent and Trademark Office*